(12) United States Patent
Vesci et al.

(10) Patent No.: US 7,294,224 B2
(45) Date of Patent: Nov. 13, 2007

(54) MAGNET ASSEMBLY FOR PLASMA CONTAINMENT

(75) Inventors: Anthony Vesci, San Jose, CA (US); Vince Kirchhoff, Morgan Hill, CA (US); James Woodward, Sunnyvale, CA (US); Kevin Hughes, San Jose, CA (US); Mark van der Pyl, Menlo Park, CA (US); Tetsuya Ishikawa, Saratoga, CA (US); Evans Lee, Milpitas, CA (US)

(73) Assignee: Applied Materials, Inc., Santa Clara, CA (US)

( * ) Notice: Subject to any disclaimer, the term of this patent is extended or adjusted under 35 U.S.C. 154(b) by 143 days.

(21) Appl. No.: 10/726,008

(22) Filed: Dec. 1, 2003

(65) Prior Publication Data

US 2005/0115678 A1 Jun. 2, 2005

(51) Int. Cl.
*H01L 21/00* (2006.01)

(52) U.S. Cl. ............... 156/345.46; 118/723 E; 118/723 R; 156/916

(58) Field of Classification Search ........... 156/345.46, 156/345.42, 345.49; 118/723 MR, 723 MA
See application file for complete search history.

(56) References Cited

U.S. PATENT DOCUMENTS

| 4,842,683 A | 6/1989 | Cheng et al. |
| 5,215,619 A | 6/1993 | Cheng et al. |
| 6,074,512 A | 6/2000 | Collins et al. |
| 6,228,235 B1 | 5/2001 | Tepman et al. |
| 6,232,236 B1 | 5/2001 | Shan et al. |
| 6,451,177 B1 | 9/2002 | Gopalraja et al. |
| 6,488,807 B1 | 12/2002 | Collins et al. |
| 2003/0192646 A1 | 10/2003 | Wu et al. |

FOREIGN PATENT DOCUMENTS

| EP | WO 191164 AS | * 12/2001 |
| JP | 2000268995 A | * 9/2000 |

OTHER PUBLICATIONS

"end." Merriam-Webster Online Dictionary. 2006-2007. http://www.m-w.com/dictionary/end (Feb. 3, 2007).*

* cited by examiner

*Primary Examiner*—Parviz Hassanzadeh
*Assistant Examiner*—Michelle Crowell
(74) *Attorney, Agent, or Firm*—Janah & Associates

(57) ABSTRACT

A magnet assembly for a plasma process chamber has a hollow collar comprising a cross-section that is absent seams. The hollow collar has an open end face and a cap is provided to seal the open end face of the collar. A plurality of magnets are in the hollow collar, the magnets being insertable through the open end face. The collar is capable of being snap fitted onto the chamber wall. The magnet assembly can also comprise one or more of the collars such that the collars, when installed, form a substantially continuous ring about a chamber wall.

31 Claims, 3 Drawing Sheets

MAGNET ASSEMBLY FOR PLASMA CONTAINMENT

BACKGROUND

An aspect of the present invention relates to a magnet assembly for a plasma process chamber.

In the fabrication of integrated circuits (ICs) and displays, a number of processes are performed on a substrate in a plasma process chamber, including the deposition and etching of layers on the substrate. Typically, the process chamber comprises a substrate support, a gas distributor, a gas energizer to form a plasma from gas, and a gas exhaust. In such chamber, a magnet assembly can also be used to generate a magnetic field about a substrate processing zone in the chamber, to for example, limit the passage of charged plasma species into an exhaust port that is part of the gas exhaust, or to control the distribution or movement of plasma species across the substrate surface. The magnet assembly is typically positioned about the chamber, for example, on a wall around the substrate support such as an external chamber wall or liner.

One type of magnet assembly comprises a housing holding a number of magnets, as described in commonly assigned U.S. patent publication No. U.S.-2003-0192646-A, filing on Apr. 12, 2002, entitled "Plasma Processing Chamber Having Magnet assembly and Method," which is incorporated herein by reference in its entirety. The housing is U-shaped to fit around a number of magnets, and is sealed by a cover plate that is welded along the open edges of the U-shaped housing. However, such magnet assemblies can be unreliable during operation. The weld seam of the housing often develops microcracks or holes with thermal cycling in the chamber, and the plasma in the chamber permeates through these holes and cracks to degrade the housing and magnets. This can have undesirable effects on the substrate being processed and the ability of the magnet assembly to contain the plasma.

Magnet assembly housings sealed by a cover plate can also be difficult to fabricate or assemble. Welding the cover plate typically involves subjecting the magnet assembly contained in the housing to high temperatures that can demagnetize or thermally degrade the magnets. It is also difficult to maintain the magnets aligned in the housing while the cover plate is being welded on to the housing. Often, some of the magnets become misaligned during assembly and this results in the magnet assembly providing an undesirable magnetic field distribution.

Furthermore, when the assembled housing is subjected to an anodizing treatment to form a protective anodization layer on the housing, the anodizing treatment material can permeate thorough any fine microcracks or holes in the weld seam to enter into the housing. The magnets can be eroded or otherwise degraded by the anodization treatment material. Also, during chamber processing, the trapped anodization material can vaporize to outgas into the vacuum environment of the chamber, affecting the substrate process.

Thus, it is desirable to have a magnet assembly that is more resistant to plasma erosion. It is further desirable to have a magnet assembly that allows easier assembly and alignment of the magnets in the housing without damaging their magnetic properties.

SUMMARY

A magnet assembly for a plasma process chamber comprises a hollow collar having a cross-section that substantially continuous and is absent seams. The hollow collar also has an open end face and a cap to seal the open end face. A plurality of magnets are in the hollow collar, the magnets being insertable through the open end face of the collar.

The magnet assembly can be used in a plasma process chamber. The chamber comprises a substrate support, a gas supply to provide process gas, a gas energizer to energize the process gas, and an exhaust to exhaust the process gas. The magnet assembly can be snap fitted onto a wall of the chamber, such as a liner or external wall, and can also be shaped to fit into a groove in the chamber wall.

A method of refurbishing the wall comprises removing the magnet assembly from the wall, cleaning a surface of the wall, and fitting the same or another magnet assembly on the wall.

BRIEF DESCRIPTION OF THE DRAWINGS

These features, aspects and advantages of the present invention will become better understood with regard to the following description, appended claims and accompanying drawings, which illustrate examples of the invention. However, it is to be understood that each of the features can be used in the invention in general, not merely in the context of the particular drawings, and the invention includes any combination of these features, where:

DESCRIPTION

Figure 1:
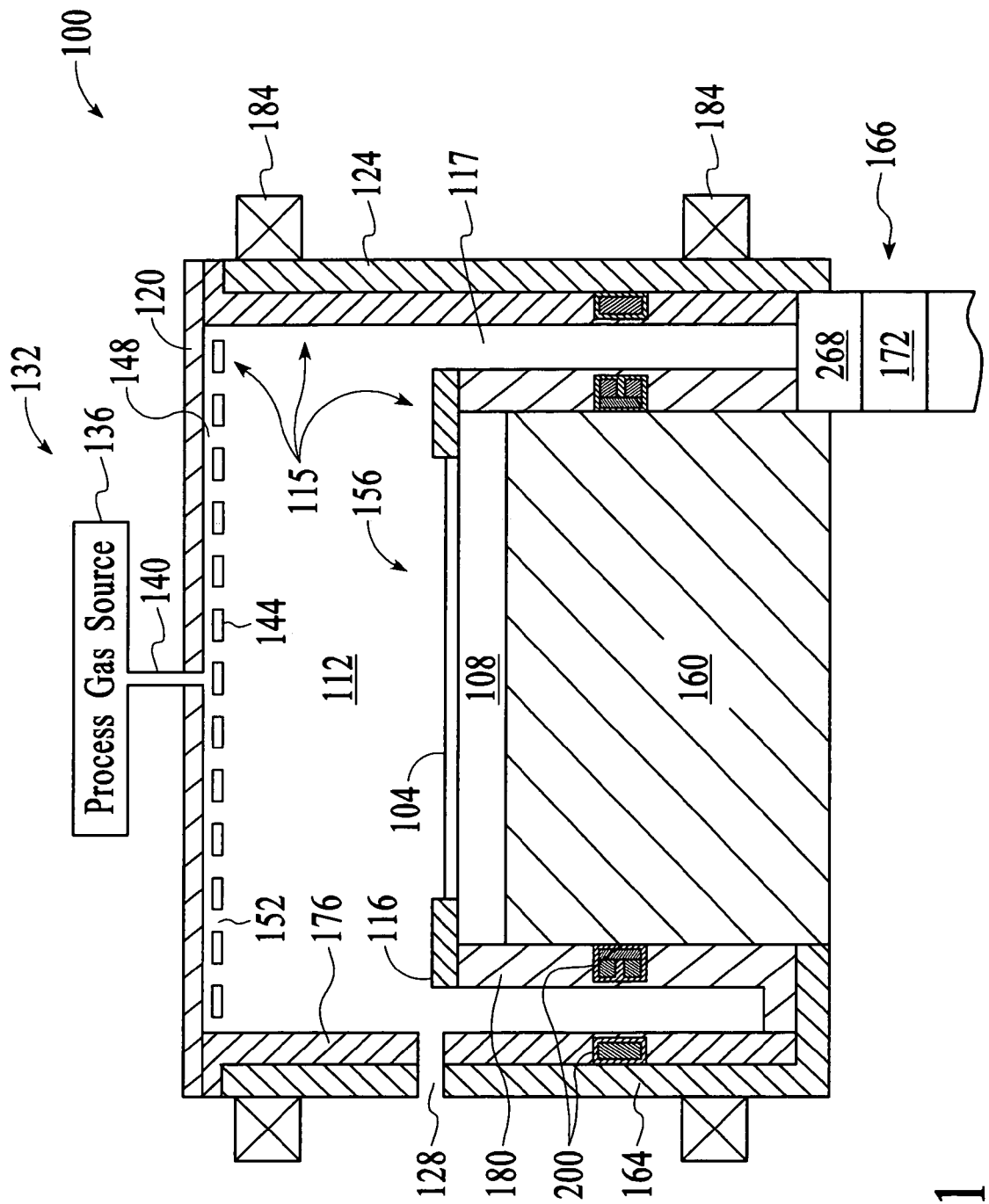
FIG. 1 is a cross-sectional side view of a plasma process chamber having a magnet assembly and that is capable of processing a substrate.

A plasma processing or process chamber 100, an exemplary illustration of which is shown in FIG. 1, may be used to conduct a process in which material is deposited on or etched from a substrate 104. An example of a commercially available plasma processing chamber is a dielectric etch chamber, such a Dielectric Etch eMax Centura™ system, commercially available from Applied Materials Inc., Santa Clara, Calif. The particular embodiment of the process chamber 100 shown herein, which is suitable for processing of substrates 104 such as semiconductor wafers, is provided only to illustrate the invention, and should not be used to limit the scope of the invention. Other process chambers capable of energizing a process gas, for example a DPS™ type chamber, also available from Applied Materials Inc., can also be used.

Generally, the chamber 100 comprises a substrate support 108 having a surface to support the substrate 104 in a process zone 112 of the chamber 100. The substrate 104 is held in place by the substrate support 108, which may be a mechanical or electrostatic chuck having a receiving surface with grooves (not shown) in which a coolant gas, such as helium, flows to control the temperature of the substrate 104. One or more walls 115 can surround the substrate support 108. For example, the walls 115 can include a quartz dielectric ring 116 about the substrate 104 to protect the support 108 from the plasma. The walls 115 can also include liners 176, 180, as described below. The walls 115 can further include external walls, such as the ceiling 120 or side walls 124. A substrate transfer port 128 in the side wall 124 can be provided to allow the substrate 104 to be transferred into and out of the chamber 100.

To perform a process on the substrate 104, the process chamber 100 is evacuated to a process pressure, and the substrate 104 is transferred to the substrate support 108 from a load lock transfer chamber (not shown), which is also at vacuum. The chamber 100 comprises a gas supply 132 to supply a process gas, which may be a single gas or a mixture of gases, to the chamber 100. The process gas is introduced into the chamber 100 through a gas distributor 144 of a gas supply 132 comprising one or more gas lines 140 that connect a process gas source 136 to an inlet manifold 148 of the gas distributor 144 that conveys process gas through apertures 152 into the process zone 112. The gas distributor 144 may comprise a showerhead plate that is located above the substrate 104 and is made from a dielectric material. A gas exhaust 166 is provided to exhaust spent process gas and etchant byproducts from the chamber 100. The gas exhaust 166 comprise an exhaust port 117 about the chamber 100, and can also include a vacuum pump 168 to pump the gas out of the chamber 100. A throttle valve 172 is provided in the exhaust port 117 for controlling the pressure in the chamber 100 by regulating the flow of the gas between the process zone 112 and the vacuum pump 168.

The chamber 100 further comprises a gas energizer 156 to energize the process gas to process the substrate 104. Typically, the gas energizer 156 couples an electric field to the process gas in the process zone 112 to energize the process gas (i) inductively by applying an RF current to an inductor coil (not shown) encircling the process chamber 100, (ii) capacitively by applying an RF current to a cathode electrode 160 and an anode electrode 164, such as the side wall 124 (as shown), or (iii) both inductively and capacitively. In the version shown, the gas energizer 156 comprises an RF power supply (not shown) to apply power to anode and cathode electrodes 164, 160. In reactive ion etching (RIE) processes, the gas energizer 156 typically energizes the process gas by capacitively coupling an RF voltage from the power supply to the cathode electrode 160 at a power level of from about 100 to about 2000 Watts, and by electrically grounding the anode electrode. Alternatively, an RF current at a power level of from about 750 Watts to about 2000 Watts can be applied to an inductor coil (not shown) to inductively couple energy into the process chamber 100 to energize the process gas in the process zone 112. The frequency of the RF current applied to the process electrodes 164, 160 or inductor coil is typically from about 50 kHz to about 60 MHz, such as about 13.56 MHz.

The plasma or energized process gas may be enhanced using electron cyclotron resonance or magnetically enhanced reactors, in which a magnetic field generator, such as electromagnetic coils 184, are used to apply a magnetic field to the plasma in the process zone 112 to increase the density and uniformity of the energized process gas. The magnetic field may comprise a rotating magnetic field with the axis of the field rotating parallel to the plane of the substrate 104, as described in U.S. Pat. No. 4,842,683, issued Jun. 27, 1989, which is incorporated herein by reference in its entirety. The magnetic field in the process chamber 100 may be sufficiently strong to enhance the plasma. For example, the magnetic field as measured on the substrate 104 may be less than about 500 Gauss, and more typically from about 10 to about 100 Gauss.

The plasma processing chamber 100 may also have a chamber liner 176 adjacent to the anode 164 and a cathode liner 180 adjacent to the cathode 160 to shield the anode 164 and cathode 160 from the plasma. The liners 176, 180 facilitate a short down time, because they can be removed from the processing chamber 100 to be wet cleaned outside the chamber 100. Additionally, the liners 176, 180 may be adapted to adjust a DC bias between the anode 164 and the cathode 160. For example, the liners 176, 180 may be of a surface area, thickness, or placement which can be selected to obtain a suitable DC bias. One or more of the liners 176, 180 may comprise a dielectric material to electrically insulate the anode 164 and cathode 160 from the plasma. The liners 176, 180 can also be concentric to one another. In the embodiment shown, one or more electrically conductive parts of the chamber walls 120, 124 serve as the anode 164. The anode shield 176 is an inwardly-facing lining at the top and sides of the chamber 100. The cathode liner 180 lines the sides of the cathode 160. In one version, the liners 176, 180 comprise annular protrusions (not shown) that function in combination as an exhaust baffle. For example, the annular protrusions may form an S-shaped channel therebetween to break the flow of gas to the gas exhaust 166.

The chamber 100 further comprises a magnet assembly 200 that serves to control a flow path or distribution of plasma species. The magnet assembly 200 is located about the section of plasma or process zone in the chamber 100 for which is desirable to control the distribution of plasma ions. For example, in one version, the magnet assembly 200 may generate a magnetic field that increases in strength along a path from the chamber center to the outwardly positioned gas exhaust 166 to impede or altogether prevent the plasma from extending into the gas exhaust 166. In this version, the chamber 100 comprises two magnetic assemblies 200, one assembly 200 attached to the chamber liner 176 and another attached to the cathode liner 180, at a location on the liners 176, 180 about the flow path to the gas exhaust 166.

Figure 2:
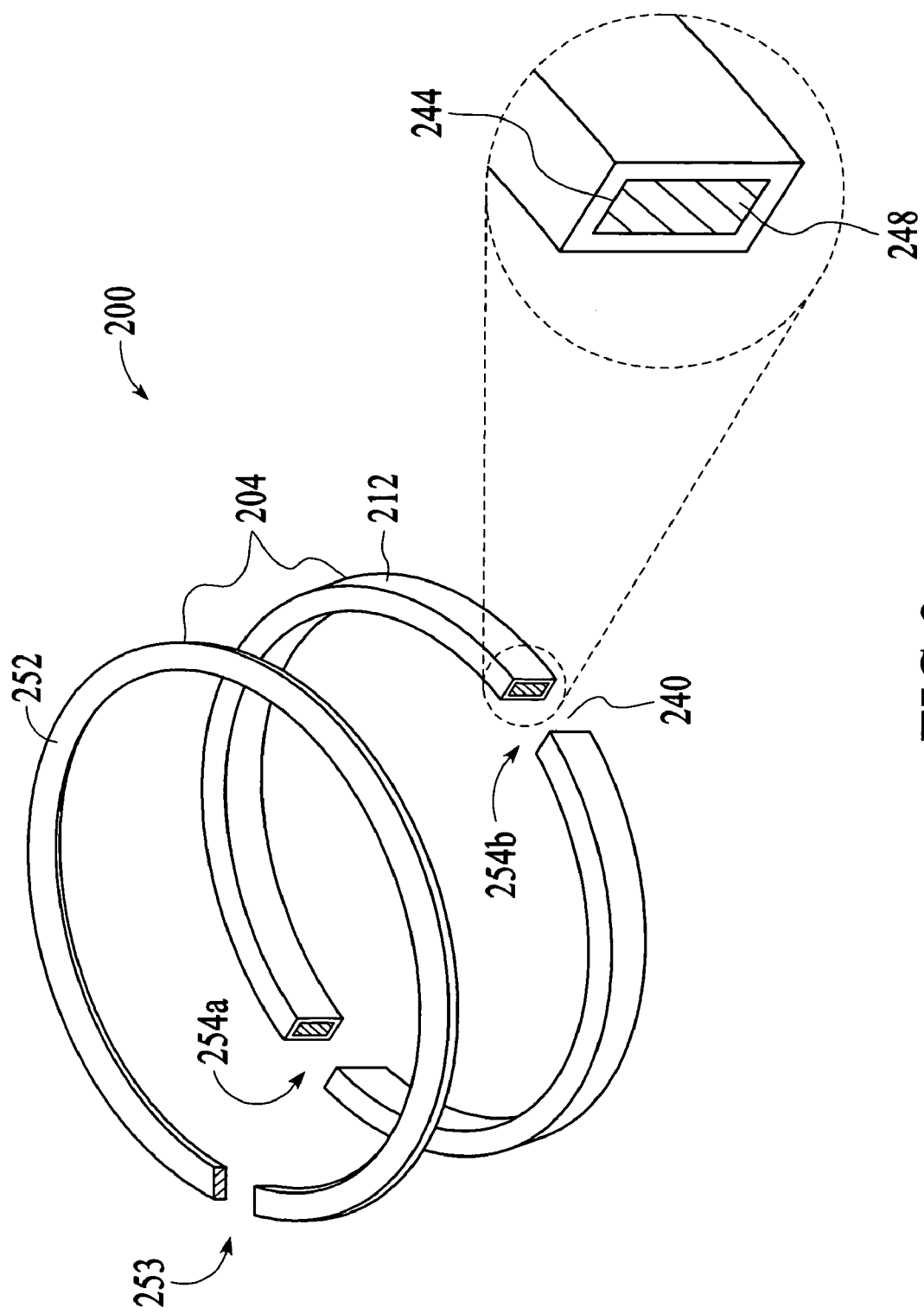
FIG. 2 is a perspective exploded view of the magnet assembly of FIG. 1 showing a detail of the hollow collar.

The magnet assembly 200, as illustrated in FIG. 2, comprises a hollow collar 204 capable of holding a plurality of magnets 208. The hollow collar 204 can form a ring segment that encircles the chamber 100, the ring segment being generally circular and conforming to the circular wall of the chamber 100. Thus, the magnet assembly 200 can comprise a single collar 204 that is split ring having a single split along its circumference. The collar 204 can also be a semi-circle ring segment 254a,b such that the two ring segments cooperate to form a substantially continuous ring about the chamber. The collar 204 can also have other shapes generally conforming to the structure about which the collar 204 is attached or supported. For example, if the chamber 100 has rectangular walls, the collar 204 is also rectangular in shape. Each collar 204 holds a plurality of pre-positioned magnets 208 abutting one another to generate a predefined annular magnetIc field in the chamber 100 and also to protect the magnets from the plasma processing environment. In one version, the collar 204 of the magnet assembly 200 is shaped to surround a substrate support 108 that is sized to fit within an inner radius of the magnet assembly 200 In another version, the collar 204 can also be contained in or around the substrate support 108 or the exhaust port 117.

Figure 3:
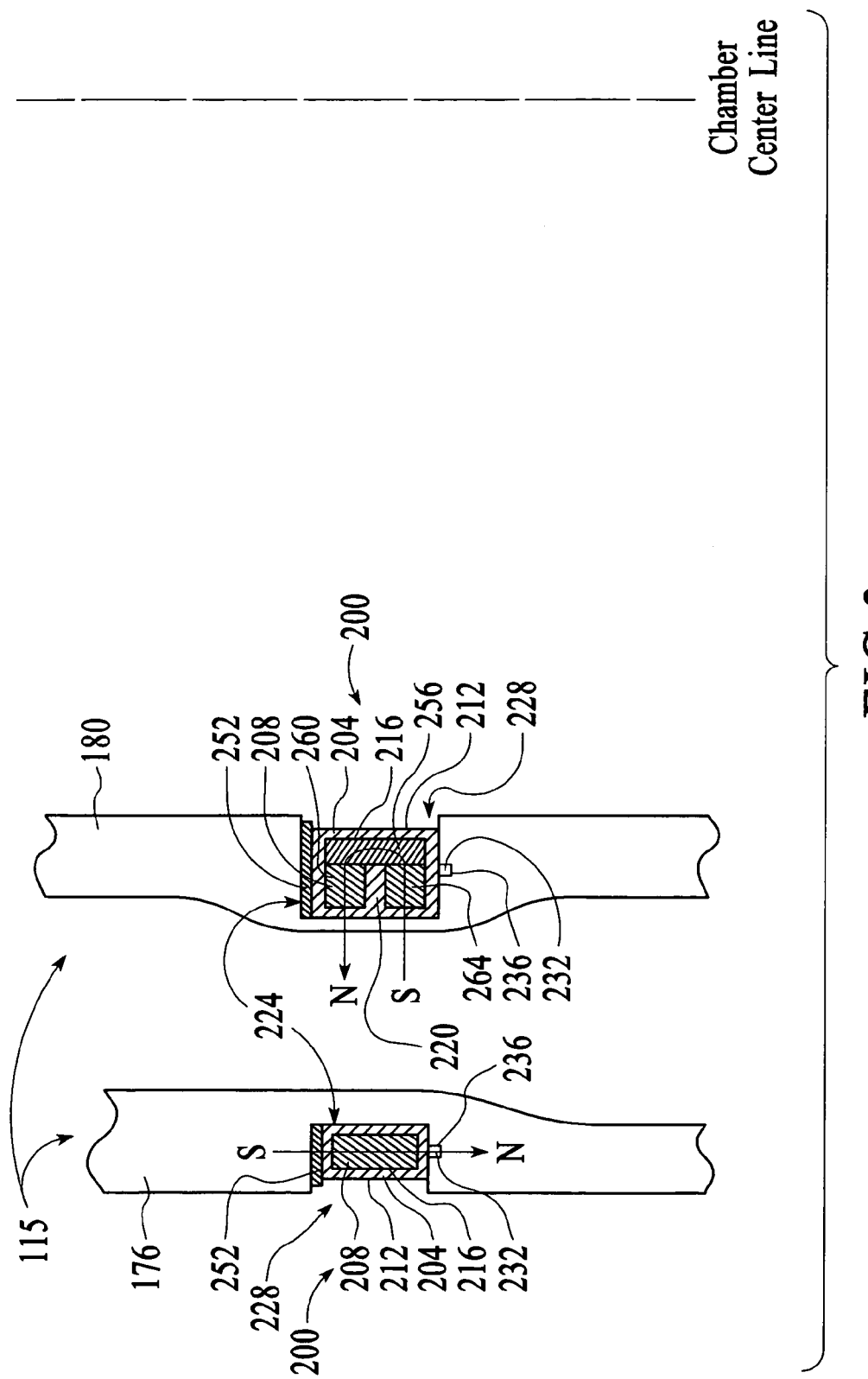
FIG. 3 is a cross-sectional view of a magnet assembly attached to a chamber liner and a magnet assembly attached to a cathode liner.

The hollow collar 204 has a continuous external surface 212 with a cross-section that is absent welds or seems. The welds or seems are subject to corrosion and etching when exposed to the plasma environment, which may lead to a breach in the collar 204 and exposure of the magnets 208 to the plasma. The unbroken cross-section protects the magnets 208 enclosed by the collar 204 from the plasma. The unbroken cross-section improves the reliability of the magnet assembly 200 by eliminating the presence of pores or microcracks that often occur in weld seams. In comparision to conventional collars, the present collar 204 provides better plasma protection, more robust operation and lower fabrication costs. This improvement in performance provides less chamber downtime and higher process throughput yields The hollow collar 204 is shaped with internal surfaces 216 that cooperate to conform to the shape of the magnets 208 so that the magnets are held therein with minimal movement, as illustrated in FIG. 3. The internal surfaces 216 of the collar 204 are collectively shaped to accommodate the plurality of magnets 208. In one version, the internal surfaces 216 form a hollow cross-section having a rectangular profile. This is advantageous when the plurality of magnets 208 in the assembly 200 are organized into a set of magnets arranged abutting one another in an annular configuration around the collar 204 to generate an annular magnetic field about the chamber.

In one version, the internal surfaces 216 of the hollow cross-section comprise a separator wall 220. The separator wall 220 may be a protrusion from one of the internal surface 216 of the hollow cross-section. A separator wall 220 is advantageous when the plurality of magnets 208 in the magnet assembly 200 are organized into two parallel sets of magnets arranged annularly around the collar 204. In this version, the separator wall 220 is located between the two parallel sets of magnets and separates the parallel magnets by a predefined separation distance. A suitable separator wall thickness is from about 0.05 inches (1.3 mm) to about 0.500 inches (12.7 mm).

The magnet assembly 200 is attached to receiving surfaces 224 within the plasma processing chamber 100. For example, in one version, the magnet assembly 200 is attached to a wall 115 such as a chamber liner 176 or cathode liner 180. In this version, the magnet assembly 200 can also be snap fitted onto the wall 115 by sizing the diameter of each collar 204 smaller than the diameter of the wall 115. The snap fitted collar 204 is shaped and sized to be sufficiently flexible to allow the collar 204 to expand diametrically when an operator pulls on the ends of the collar 204. The expanded collar 204 is then releasably applied to the wall 115, whereupon it reverts to its original diameter and securely grips the circumference of the wall 115. The external surface 212 of the collar 204 can also have a profile that is shaped to mate to a corresponding groove 228 in the surface of a wall 115, such as the chamber liner 176 or cathode liner 180. For example, the external surface 212 of the magnet assembly 200 can form a rectangular cross-sectional profile that mates to a corresponding rectangular groove 228 in the chamber liner 176 or cathode liner 180.

The external surface 212 of the collar 204 can also have a key 232 to couple to a corresponding slot 236 on the receiving surface 224 of the chamber 100, such as a slot 236 located on a receiving surface 224 of the groove 228 in the chamber liner 176 or cathode liner 180. The key 232 aids in the proper alignment of the assembly 200 to the receiving surface 224. For example, the key 232 aids in the alignment of the assembly 200 to the liner 176, 180 in a certain preferred orientation. In one version, the plurality of magnets 208 may be arranged within the assembly 200 to have a certain polarity relative to the location of the key 232. Using the known relationship of the polarity to the key, the assembly 200 can then be attached to the liner 176, 180 with the polarity of the plurality of magnets 208 maintained in a desirable relationship relative to the chamber 100.

In one version, the collar 204 comprises a substantially continuous annular structure with a gap 240 at a split along its circumference. The gap 240 is a predefined distance between the adjacent split ends of the collar 204. For example, the gap can extend a predefined number of degrees of rotation about the center of the radius of the collar 204. In one version, once attached to the receiving surface 224 of the chamber 100, the gap 240 extends through an angle of about 1 to about 5 degrees, to avoid interference during installation. The gap 240 facilitates attachment of the magnet assembly 200 to the receiving surface 224 of the chamber 100, such as the groove 228 in the chamber and cathode liners 176, 180. The collar 204 can be diametrically expanded by widening the gap 240, allowing relatively flexible manipulation in space of the magnet assembly 200 about the liners 176, 180. This diametric expansion allows snap fitting of the collar 204 to the groove 228 in the liners 176, 180, including the alignment of the key 232 to the corresponding slot 236 and the attachment of the retaining ring 252. Thus, the gap 240 is sized so that the collar 204 can expand a sufficient amount to be snap fitted onto a wall of the process chamber 100.

An open end face 244 to the interior volume of the collar 204 is located about the gap 240. In one version, both sides of the gap 240 are faced by open end faces 244 to the interior of the collar 204. The open end faces 244 are used to insert a plurality of magnets 208 into the collar 204. The open end faces 244 into the interior of the collar 204 are sized to accept the magnets 208 and the outline of the open end faces 244 can correspond to the profile formed by the internal surfaces 216 of the hollow cross-section.

The magnet assembly 200 further comprises a cap 248 to seal the open end face 244. There are as many caps 248 as open end faces 244. The caps 248 seal the open end faces 244 to protect the plurality of magnets 208 within the collar 204 from exposure to the plasma environment. The caps are composed of a material resistant to the plasma environment. In one version, the caps are composed of a material such as aluminum or steel. The caps 248 are attached to the open end faces 244 using an epoxy suitable to withstand the plasma environment. In one version, the epoxy used to seal the caps 248 into the open end face 244 can be HySol Epoxy 1C from Henkel Loctite Corporation, located in Rocky Hill, Conn., but other, equivalent epoxies can also be used.

The magnet assembly 200 may further comprise a retaining ring 252 to retain the assembly 200 within the groove 228 in the liner 176, 180. The retaining ring 252 fits between an external surface 212 of the collar 204 and a receiving surface 224 of the groove 228 in the liner 176, 180. The groove 228 in the liner 176, 180 can be sized slightly larger than the collar 204 to allow ease of placement of the collar 204 within the groove 228. The retaining ring 262 can be attached to take up the slack between the hollow collar 204 and the groove 228. The retaining ring 252 has a split 253 along its circumference. The retaining ring 252 is relatively easier to handle than the hollow collar 204 containing the magnets 208, and thus, facilitates attachment of the magnet assembly 200 to the receiving surface 224.

The magnets 208 are typically permanent magnets that, for example, comprise a ferromagnetic material, such as a rare earth metal. The rare earth metal is able to generate a strong magnetic field relative to the amount used. For example, the magnets 208 may comprise neodymium-iron-boride or samarium-cobalt. The magnets are sized to be insertable through the open end face 244 of the collar 204. Each individual magnet 208 has a magnetic axis aligned with its north and south poles, and a polarity direction running from the south to north pole. The magnets 208 may be coated with an adhesive prior to their insertion and assembly into the magnet assembly 200. The adhesive keeps the magnets 208 from moving or shifting inside the magnet assembly 200 in response to electromagnetic fields that may be present in the processing chamber 100.

The magnet assembly 200 provides an arrangement of a plurality of magnets 208 into an annular configuration about a chamber wall 115 or other chamber or component structure, to generate a magnetic field in the chamber 100. In one embodiment, the magnet assembly 200 attached to the chamber liner 176 contains a plurality of magnets 208 arranged annularly such that the polarity of each magnet 208 is aligned to a central axis of the chamber 100 that runs vertically through the center of the chamber from the top to the bottom of the chamber 100. In this version, the plurality of magnets 208 are positioned in the collar 204 such that their south poles are directed upwardly and the north poles are directed downwardly.

In another embodiment, the magnet assembly 200 attached to the cathode liner 180 contains two sets of magnets 208 that are parallel to each other. Within each set, the magnets 208 are arranged in an annular configuration in the collar 204 such that the magnetic axis or polarity of each individual magnet 208 is oriented perpendicular to the wall of the chamber 110 or horizontal relative to the central axis of the chamber 100. This arrangement comprises a first upper set 260 of magnets 208 and a second lower set 264 of magnets 208. The magnetic axes or polarity of the first set 260 points from the center of the chamber 100 outward along a radial direction relative to a circular chamber 100. The magnetic axis or polarity of the second set 264 points in the opposite direction, pointing from the outer portion of the chamber 100 into the center of the chamber 100. The above polarity configurations are only exemplary, however, and other polarity configurations are possible and fall within the spirit of the present invention.

The magnet assembly 200 may further comprise one or more pole pieces 256 to separate magnets 208 arranged in parallel within the collar 204. A suitable pole piece 256 is composed of ferromagnetic material. The addition of a pole piece 256 between parallel magnets 208 may create a specific magnetic field configuration. For example, in FIG. 3, the addition of a pole piece 256 is positioned to south poles of the first set 260 of magnets 208 to the north poles of a second set 264 of magnets 208 to create a circular horse-shoe magnet having both north and south poles facing the same direction.

The collar 204 may be composed of a material resistant to degradation in a plasma environment. In one version, the collar 204 is composed of aluminum. In another version, the collar 204 may be composed of stainless steel. The collar 204 may be manufactured using a number of methods, including extrusion, casting, machining and forging.

After extended exposure to the plasma environment, the walls 115 in the chamber 100 may be cleaned and refurbished. In the refurbishment process, the magnet assembly 200 is removed from a chamber wall 115, such as a liner 176, 180, to allow cleaning of the wall. The wall 115 is then cleaned, for example, by a cleaning solution employing an acid or base, the cleaning process being conducted outside the chamber 100; or they may also be cleaned by a plasma dry cleaning process conducted in the chamber 100. The same magnet assembly 200 or a new one is then fitted back onto the wall and the wall 115 is reinserted into the chamber 100. In addition, the hollow collar 204 also allows a new set of magnets 208 to be substituted, or the magnets 208 can be removed for use in another hollow collar 204. In the latter method, the cap seal of the collar 204 is broken and the cap 248 is opened. The magnets 208 are removed from the open end face in the hollow collar 204. The magnets 208 may be cleaned and reused, and the hollow collar 204 itself, can also be cleaned and re-used. Alternatively, a plurality of new magnets 208 are also be re-inserted through the open end face 244 of the hollow collar 204. The new magnets 208 may be cleaned versions of the used magnets or other magnets. The open end face 244 is then sealed with a second cap 248 to form another magnet assembly 200. Thus, the present magnet assembly 200 advantageously allows reuse or replacement of the magnets 208 contained therein. It also allows replacement of the magnet assembly 200 as a complete assembly within the wall 115.

Although the present invention has been described in considerable detail with regard to certain preferred versions thereof, other versions are possible. For example, the magnet assembly 200 can be used for other chambers or for other processing applications, as would be apparent to one of ordinary skill in the art. Alternative geometrical shapes and configurations may also be substituted for the illustrative versions of the collar 204 or arrangements of the magnets 208, for example, the magnets 208 may be disc or pole shaped, and the collar 204 can be shaped to conform to the disc or pole shaped magnets, respectively. Therefore, the appended claims should not be limited to the description of the preferred versions contained herein.

What is claimed is:

1. A magnet assembly for a plasma process chamber comprising a wall, the magnet assembly comprising:
    (a) a hollow collar comprising a radially internal and external surface, and a cross-section that is absent seams, the collar having a gap extending from about the radially internal surface to about the external surface, the gap defining opposing faces, at least one face having an open end, and the collar sized to diametrically expand and snap fit the wall of the process chamber so that the radially internal surface directly contacts the process chamber wall;
    (b) a cap to seal the at least one open end face; and
    (c) a plurality of magnets in the hollow collar, the magnets being insertable through the open end face.

2. A magnet assembly according to claim 1 wherein the hollow collar is shaped to fit into a corresponding groove on the wall of the process chamber.

3. A magnet assembly according to claim 2 further comprising a retaining ring to retain the hollow collar in the groove of the wall of the process chamber.

4. A magnet assembly for according to claim 1 further comprising a key on the external surface of the hollow collar to couple to a corresponding slot on a surface of the wall of the process chamber.

5. A magnet assembly according to claim 1 wherein the plurality of magnets abut one another to generate an annular magnetic field about the process chamber.

6. A magnet assembly according to claim 1 wherein the plurality of magnets are positioned in the hollow collar such that their south poles are directed upwardly and the north poles are directed downwardly.

7. A magnet assembly according to claim 1 wherein the plurality of magnets are positioned in the hollow collar such that the magnetic axes of the magnets are oriented perpendicular to the wall of the process chamber.

8. A magnet assembly according to claim 7 wherein the plurality of magnets are positioned such that a first set of magnets have their magnetic axis oriented in one direction, and a second set of magnets have their magnetic axis oriented In the opposite direction.

9. A magnet assembly according to claim 8 further comprising one or more pole pieces coupling the first and second set of magnets.

10. A magnet assembly according to claim 8 further comprising a separator wall between the first and second sets of magnets.

11. A magnet assembly of claim 1 comprising a plurality of hollow collars, wherein each hollow collar Is a segment of a ring sized to fit around the wall of the process chamber.

12. A plasma process chamber comprising at least one wall having the magnet assembly of claim 1 fitted thereon, the process chamber further comprising:
   (i) a substrate support:
   (ii) a gas supply to provide process gas;
   (iii) a gas energizer to energize the process gas; and
   (iv) an exhaust to exhaust the process gas.

13. A chamber according to claim 12 wherein the wall of the chamber comprises a groove to receive the magnet assembly.

14. A chamber according to claim 12 comprising a pair of concentric walls that each comprise a magnet assembly.

15. A chamber according to claim 14 wherein in one of the magnet assemblies, the plurality of magnets are positioned in the hollow collar such that the magnetic axes of the magnets are oriented perpendicular to the wall of the process chamber; and wherein
   in the other magnet assembly, the plurality of magnets are positioned such that a first set of magnets have their magnetic axes oriented in one direction, and a second set of magnets have their magnetic axes oriented in the opposite direction.

16. A magnet assembly for a plasma process chamber comprising a wall having a groove, the magnet assembly comprising:
   (a) a hollow collar comprising a radially internal and external surface, and a cross-section that is absent seams, the collar having a gap extending from about the radially internal surface to about the external surface, the gap defining opposing faces, at least one face having an open end, and the collar sized to diametrically expand and snap fit the wall of the process chamber so that the radially internal surface directly contacts the process chamber wall;
   (b) a cap to seal the at least one open end face;
   (c) a plurality of magnets positioned in the hollow collar such that the magnetic axes of the magnets are oriented perpendicular to the wall of the process chamber; and
   (d) a retaining ring to retain the hollow collar in the groove of the wall of the process chamber.

17. A magnet assembly according to claim 16 further comprising a key on the external surface of the hollow collar to couple to a corresponding slot on a surface of the wall of the process chamber.

18. A magnet assembly according to claim 16 wherein the plurality of magnets are positioned such that a first set of magnets have their magnetic axes oriented in one direction, and a the second set of magnets have their magnetic axes oriented in the opposite direction.

19. A magnet assembly for a plasma process chamber comprising a wall, and a liner having a groove, the magnet assembly comprising:
   (a) a hollow collar comprising a radially internal and external surface, and a cross-section that is absent seams, the collar having a gap extending from about the radially internal surface to about the external surface, the gap defining opposing faces, at least one face having an open end, and the collar sized to diametrically expand and snap fit the groove of the liner of the process chamber so that the radially internal surface directly contacts the liner;
   (b) a cap to seal the at least one open end face;
   (c) a plurality of magnets in the hollow collar that abut one another to generate an annular magnetic field about the process chamber, the magnets being positioned in the hollow collar such that their magnetic axes are oriented perpendicular to the wall of the process chamber; and
   (d) a key on the external surface of the hollow collar to couple to a corresponding slot on a surface of the liner of the process chamber.

20. A magnet assembly according to claim 19 wherein the plurality of magnets are positioned such that a first set of magnets have their magnetic axes oriented in one direction, and a the second set of magnets have their magnetic axes oriented in the opposite direction.

21. A magnet assembly according to claim 20 further comprising a separator wall between the first and second sets of magnets.

22. A liner assembly for a process chamber comprising a wall, the liner assembly comprising:
   (a) a liner having a groove; and
   (b) a magnet assembly comprising:
      (i) a hollow collar comprising a radially internal and external surface, and a cross-section that Is absent seams, the collar having a gap extending from about the radially internal surface to about the external surface, the cap defining opposing faces, at least one face having an open end, and the collar sized to diametrically expand to snap fit the groove of the liner so that the radially internal surface directly contacts the liner;
      (ii) a cap to seal the at least one open end face; and
      (iii) a plurality of magnets in the hollow collar, the magnets being insertable through the open end face.

23. A liner assembly according to claim 22 further comprising a retaining ring to retain the hollow collar in the groove of the liner.

24. A liner assembly for according to claim 22 further comprising a key on the external surface of the hollow collar to couple to a corresponding slot on a surface of the liner.

25. A wall assembly for a process chamber, the wall assembly comprising a wall having a groove and the magnet assembly of claim 1 fitted to the groove.

26. A magnet assembly according to claim 1 wherein the hollow collar comprises a single continuous curve extending at least about 180 degrees.

27. A magnet assembly according to claim 16 wherein the hollow collar comprises a single continuous curve extending at least about 180 degrees.

28. A magnet assembly according to claim 19 wherein the hollow collar comprises a single continuous curve extending at least about 180 degrees.

29. A liner assembly according to claim 22 wherein the hollow collar comprises a single continuous curve extending at least about 180 degrees.

30. A magnet assembly according to claim 1 wherein the wall is a liner.

31. A magnet assembly according to claim 16 wherein the wall is a liner.

* * * * *